US006080521A

United States Patent [19]

Muller et al.

[11] Patent Number: 6,080,521

[45] Date of Patent: Jun. 27, 2000

[54] UNIVERSAL DIAZOTYPE PRECOAT FOR APPLICATION TO BASE PAPERS WITH ACIDIC OR ALKALINE SIZING

[75] Inventors: Peter Muller; Sidney G. Garnish; Ronny L. Gonzalez, all of Port Washington, N.Y.

[73] Assignee: Andrews Paper & Chemical Co., Inc., Port Washington, N.Y.

[21] Appl. No.: 09/097,492

[22] Filed: Jun. 15, 1998

[51] Int. Cl.[7] .................................................. G03F 7/021

[52] U.S. Cl. .......................... 430/161; 430/157; 430/160; 430/168; 430/171

[58] Field of Search .................................... 430/161, 160, 430/171, 157, 168

[56] References Cited

U.S. PATENT DOCUMENTS

| | | | |
|---|---|---|---|
| 3,615,570 | 10/1971 | Werner et al. | 96/91 |
| 4,128,423 | 12/1978 | Vosbeek | 430/161 |
| 4,584,256 | 4/1986 | Ceintrey et al. | 430/159 |

*Primary Examiner*—John S. Chu

*Attorney, Agent, or Firm*—Pitney, Hardin, Kipp & Szuch, LLP

[57] ABSTRACT

A diazotype reproduction material is a fibrous paper base having at least one overcoat, which is an acidic diazotype layer and a layer strata below the overcoat containing an anionic compound to minimize deep penetration of diazotype diazonium salts.

8 Claims, 1 Drawing Sheet

UNIVERSAL DIAZOTYPE PRECOAT FOR APPLICATION TO BASE PAPERS WITH ACIDIC OR ALKALINE SIZING

BACKGROUND OF THE INVENTION

1. Field of the Invention

This invention relates to diazotype and more particularly relates to a method for diazotype on paper, even alkaline paper.

2. Brief Description of Related Art

Diazotypy is a copying process for making copies from originals by exposing them in contact with a diazotype sensitive copying sheet to ultraviolet light and by developing the diazotype sheet thereafter with ammonia or a liquid developer. The diazotype process because of its ease and economics has found wide application during the last 40 years.

Diazotype copying materials are made by applying a light-sensitive diazo coating to the surface of a base, such as foils, opaque paper, translucent paper, or cloth. The active components of the light-sensitive layer are monomolecular, crystalline, not self-supporting and need a resinous or a fibrous substrate as carrier material.

If paper is used as the carrier material, the diazotype coating penetrates into and disperses in the top surface of the paper and the diazotype print lines of the final copy are well anchored within the fibrous structure of the paper.

Base paper for diazotype coatings has previously been acidic to minimize decomposition of the diazo compound as well as precoupling of the diazotype paper upon shelf aging (R. H. Mosher, Specialty Papers page 232, Remsen Press 1950; Douglas Poundrier, Tappi April 1963, Diazo For Papermakers). The pH of diazotype base paper, in general, has previously ranged from 4.5 to 5.

Alkaline sized paper has become popular since the early 1980s for various reasons, such as elimination of equipment corrosion problems from acidic sizing, facilitation of more environment friendly waste water disposal, and using low cost calcium carbonate as filler, which is not compatible with acid sized paper, but can be used for sheet opacity and sheet brightness improvement.

Once paper mills switch from acid to alkaline sizing they cannot practically revert to acid sizing. As a result, the availability of acid sized base paper for the diazo coating industry diminished substantially. Alkaline sized paper, particularly with calcium carbonate as filler, cannot be used for stable conventional diazotype coatings. The alkaline sized paper has poor hold out for the sensitizing solutions and the stabilizing acid from the diazotype coating preparation penetrates into the base sheet. The stabilizing acid is neutralized by a calcium carbonate filler. Precoupling and decomposition of the diazo compounds will occur. The diazotype process is described by Jaromir Kosar: Light Sensitive Systems, John Wiley & Sons, New York.

Diazotypes, in their early beginnings, were made by coating diazo compounds, with or without coupling components, and their stabilizing agents directly on paper base. In the latter 1940's precoating of base paper for diazotypes was introduced. This was carried out by applying a layer of silica or resin dispersions or both to the paper base prior to sensitizing with the light sensitive coating. The objective of this earlier precoating was an optical activation of the print dye appearance for increased print contrast and print color value. The earlier precoating process per se however did not stop the diazotype chemicals from entering into the surface strata of the paper base.

In the 1970s, diazotype intermediates, on transparentized paper, with erasability features were introduced for easy correction of print lines. Erasability was achieved by resin interlayers between the translucent base and the diazotype coating (cf. U.S. Pat. Nos. 3,923,518 and 4,058,399). For easy mechanical erasability it was important that the resin interlayer exhibited only a limited adhesion to the base paper.

Diazotypes for moist development with a controlled minimum amount of liquid developer application to the sensitized side of the paper only, for rapid print drying, were disclosed in U.S. Pat. No. 4,128,423. A resin layer was applied to conventional opaque diazo base paper which prevents wet curl of the prints during the moist development process.

All heretofore practiced diazotype paper used acid sized base paper as discussed above. There is no prior art known to us for the use of base paper with neutral or alkaline sizing or with calcium carbonate as a filler.

SUMMARY OF THE INVENTION

The invention comprises a diazotype reproduction material, which comprises;

a) a sheet of fibrous paper base having a top surface and a bottom surface;

b) a precoating on the top surface of the paper base, containing an anion contributing compound; and c) at least one overcoat on the precoat, which is a light-sensitive acidic diazotype composition.

BRIEF DESCRIPTION OF THE DRAWING

The accompanying drawing is a cross-sectional side elevation (enlarged) of an embodiment reproduction material of the invention.

DETAILED DESCRIPTION OF THE PREFERRED EMBODIMENTS OF THE INVENTION

Figure 1:
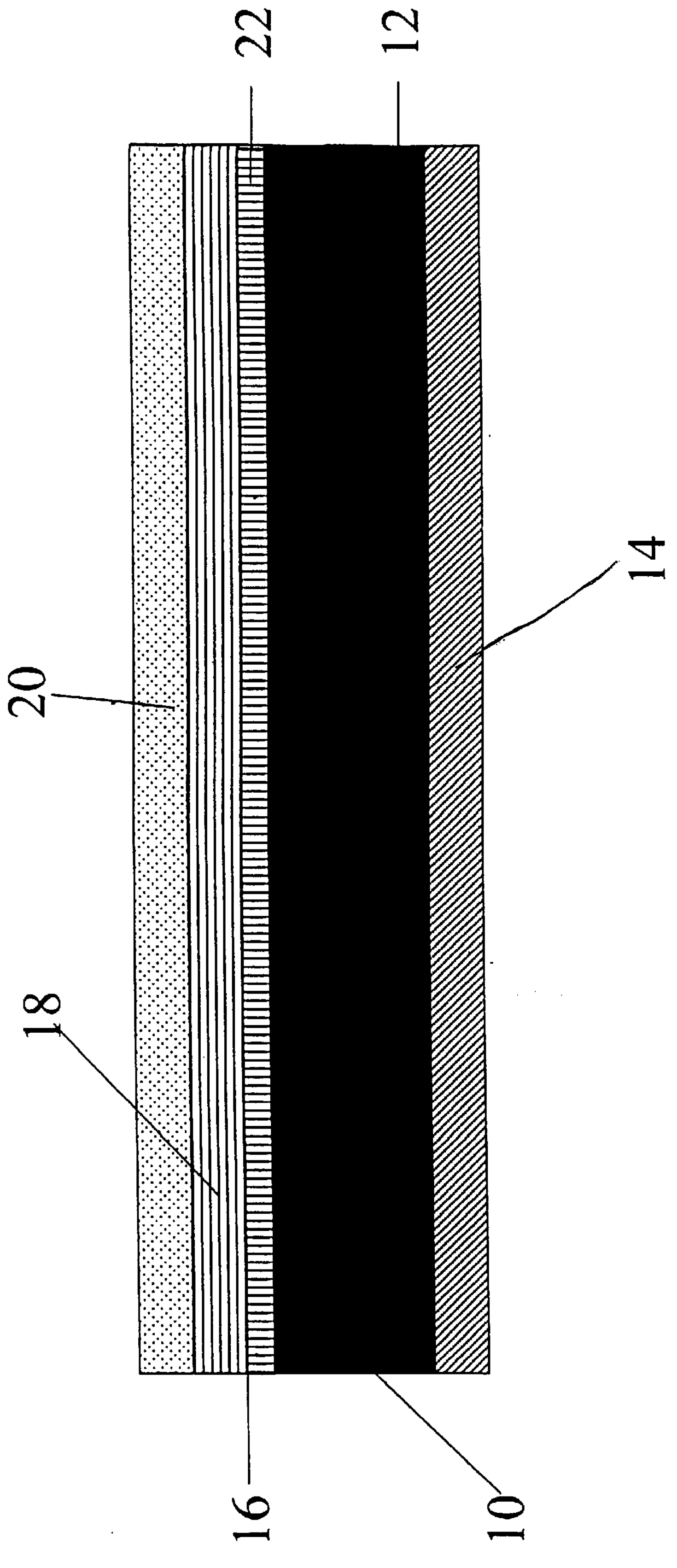

We have discovered that certain additives to a precoat on base paper, followed by an overcoat of diazonium compounds, can form diazonium radicals with salts or complexes of low solubility and protect the overcoat of acidic diazotype sensitizing solution from degradation caused by an alkalinity of the paper base or the presence of calcium carbonate in the paper base. Additionally, some of the additives or their combination have a contrast improving effect, improving receptivity for diazo overcoating while minimizing penetration.

The application of the invention in diazotype allows for the usage of base paper with an alkaline pH or with alkaline fillers such as calcium carbonate. The pre-coated base paper provides a diazotype reproduction media with extended shelf life and improved print contrast.

The additives used in the precoat are preferably as colorless as possible in order to not unduly reduce the reflection density of the print background. While not being bound to any theory of operation, it is believed that the precoat described herein exhibits a limited aqueous solution compatibility with diazo compounds. When overcoated with diazotype sensitizing solutions, the pre-coat forms a salt or complex with the diazo compound at the surface of the base paper forming low water-solubility barriers that stop or minimize further penetration of the diazo compounds into the paper base.

As additives that are used in the pre-coat formation, advantageously included are anion-contributing compounds. They may be incorporated into the base paper or into the base paper surface sizing composition at the paper mill during manufacture.

The term "anion-contributing compound" as used herein means a compound, organic or inorganic; which will in aqueous media ionize and provide a negatively charged ion for reaction with a cation of a light-sensitive diazonium compound, is an anion donor.

Representative anion-contributing compounds for inclusion in the precoat applications are well known and include:

- water soluble salts of isophthalic-5-sulfonic acid,
- water soluble salts of dimethyl iso-phthalic sulfonate,
- water soluble salts of polyesters with iso-phthalic sulfonate radicals,
- water soluble salts of hexafluophosphoric acid,
- water soluble salts of fluor boric acid,
- water soluble salts of hexchlorostannic acid,
- water soluble salts of tungstic acid, and the like and mixtures thereof.

Salts of thiocyanic acid exhibit the same effect even if to a lesser degree. The combination of thiocyanic acid salts, however, with the above mentioned anion-contributing compounds, activates the precoat layer by increasing quantity receptivity for the diazo sensitizing layer without further penetration.

Precoats described herein can be applied even to base papers with an acidic or alkaline pH that are slack sized, tend to fiber raising, and exhibit suction hole marks from the manufacturer's paper machine. This minimizes effects from the above mentioned base paper defects.

Diazo compounds for aqueous coating applications are well known as are methods of their preparation; see for example U.S. Pat. Nos. 3,923,518 and 3,996,056, incorporated herein by reference thereto. They are water soluble and generally are stabilized as zinc chloride double salts or as bisulfate salts.

Prior art precoats for diazotype papers are not continuous films but discontinuous layers of inert particles with just enough binder for the particles to cohere among each other and to adhere to the paper base. They are generally pervious to ammonia and water vapors.

The effect of the inventive additives employed in precoats of the present invention on the diazo compounds used in the overcoat sensitizing solution, is to insolubilize them from solution and thus minimize their deeper penetration into the base paper. The additives have little effect on the other components of the diazonium sensitizing solution. Thus, the precoat additives can be used with any prior art precoat composition, unless some particular component of the pre-coat produces an adverse effect with the additive.

The expected shelf life of diazotype papers can be established in accelerated aging tests. The test is carried out by exposing sensitized diazotype sheets to an atmosphere of 50% RH at 50° C. for 24 hours and image wise exposing the sheets to UV light and developing thereafter, in comparison with a control sheet which has not undergone the accelerated aging conditions. Print background color increase indicates the degree of premature coupling and the loss of print line density indicates the degree of decomposition of the diazo compound.

In the course of this invention we have found that diazotype reproduction materials prepared according to this invention on alkaline sized base paper, even containing calcium carbonate, age better, with less precoupling and less diazo decomposition than conventionally sized base paper with acidic pH when sensitized with identical diazotype coating preparations.

Illustrative of the invention is the embodiment depicted in the accompanying drawing, which is a cross-sectional side elevation (enlarged) of a base, fibrous sheet 10 of paper. In the embodiment of the drawing, the lower surface 12 of the base sheet 10 has been back-coated with a conventional backcoat 14. The top or upper surface 16 has received a pre-coat 18 of the invention including the anion-contributing compound or compounds. An over-coating 20 contains the light-sensitive diazonium compounds. Immediately below surface 16 of sheet 10 is a zone 22 formed by the downward migration of the anion-contributing compound or compounds from pre-coat 18 and the light-sensitive diazonium compound from overcoat 20. In the zone 22, reaction of the diazonium compounds and the anion made available results in a barrier of relatively insoluble reaction products. The barrier results in limiting further penetration of the diazoneum compound into the base sheet 10 matrix.

Having described the principles of the invention, the following examples are given by way of illustration only and show the manner and process of carrying out the invention.

EXAMPLE NO. 1

On a commercial diazotype coating machine, equipped with three air knife coating stations for base coating (precoating), sensitizing and back coating and with high velocity hot air convection drying, a cellulosic paper with alkaline sizing and containing 18% calcium carbonate as filler and having a basis weight of 75 g/m$^2$, was treated in sequence on the three coating stations at a coating speed of 3000 m/h with the following preparations:

Precoat composition:

| | | |
|---|---|---|
| sodium 5-sulfo-iso-phthalic acid | 2,500 | g |
| NaSCN | 2,000 | g |
| Pigment 2820[1] | 5,000 | g |
| Resin VN[2] | 7,000 | cc |
| 40% microwax Dispersion[3] | 600 | cc |
| Water to make | 100 | liters |

Blueline Diazo Sensitizing Preparation (applied at sensitizing station): prepared by dissolving and dispersing the following ingredients, with mechanical stirring:

| | | |
|---|---|---|
| citric acid | 2500 | g |
| sulfuric acid (98%) | 100 | cc |
| caffeine | 750 | cc |
| coupler 144[4] | 1000 | g |
| thiourea | 1000 | g |
| diazo 59S[5] | 1350 | g |
| dipropylene glycol | 1500 | cc |
| zinc chloride | 3500 | g |
| wetter 27[6] | 100 | g |
| pigment 2820[1] | 250 | g |
| resin VW-2[7] | 1000 | cc |
| water, to make | 100 | liters |

Back Coat Preparation

The backcoat solution was applied on the backcoat station.

| | | |
|---|---|---|
| dextrin | 3000 | g |
| Pigment "R"[8] | 3000 | g |
| Resin PS75N[9] | 20 | liters |
| water, to make | 100 | liters |

[1]Pigment 2820: amorphous silica powder of 1.5 micron particle size, (Andrews Paper & Chemical Co., Inc., Port Washington, New York.)
[2]Resin VN: Vinyl acetate copolymer dipersion, (Andrews Paper & Chemical Co., Inc., supra
[3]Microwax dispersion, (Andrews Paper & Chemical Co., Inc. supra.)
[4]coupler 144: 2 Hydroxynaphthalene-carboxylic acid-3'-Morpholino-propylamide.
[5]Diaxo 59S: 1-Diazo-2,5-diethoxy-4-morpholinobenzene bisulfate.
[6]Dihydroxy dialkyl hexyne
[7]Resin VW-2: anionic aqueous dispersion of vinyl acetate homopolymer; Andrews Paper and Chemical Co., Inc., supra.
[8]Pigment R: non-cooked rice starch paritcles.
[9]Resin PS75N: anionic aqueous dispersion of vinyl chloride acrylate copolymer.

[7] Resin VW-2: anionic aqueous dispersion of vinyl acetate homopolymer; Andrews Paper and Chemical Co., Inc., supra.
[8] Pigment R: non-cooked rice starch particles.
[9] Resin PS75N: anionic aqueous dispersion of vinyl chloride acrylate copolymer.

The paper was dried after each coating application before the following coating was applied. After the last drying step, the paper had a residual moisture of 3.5%.

EXAMPLE NO. 2

Example No. 1 was repeated except for the precoat composition which was replaced as follows:

| | |
|---|---|
| Pigment 2820[1] | 5000 g |
| resin VN[2] | 7000 cc |
| 40% microwax Dispersion[3] | 600 cc |
| water to make | 100 liters |
| ammonia, to adjust the pH to 6 | |

[1]Pigment 2820: amorphous silica powder of 1.5 micron particle size, (Andrews Paper & Chemical Co., Inc., Port Washington, New York.)
[2]Resin VN: Vinyl acetate copolymer dipersion, (Andrews Paper & Chemical Co., Inc., supra
[3]Microwax dispersion, (Andrews Paper & Chemical Co., Inc. supra.)

Sensitized samples from Examples No. 1 and No. 2 were exposed to UV light behind a Kodak Projection Print Scale and developed in an atmosphere of ammonia and water vapors on a commercial Ozamatic diazotype printing machine immediately after coating and drying.

Prints from Example No. 1 exhibited conventional features in respect to printing speed and print contrast, without penetration marks. Prints from Example No. 2 printed slightly slower and exhibited many tiny dark blue penetration spots.

Sensitized sheets from both examples were incubated for 24 hours in a closed oven with an atmosphere of 50% relative humidity at 50° C. Such exposure is an accelerated aging test and simulates shelf storage of 4 months under ambient warehouse conditions. After 24 hours, the sample sheets were printed and developed in the same manner as the non-aged sample sheets.

The aged sheets from Example No. 1 exhibited a slight bluish print background with very little loss in print color density.

The aged sheets from Example No. 2 exhibited a dark blue print background from pronounced precoupling and the print color density was substantially weaker than obtained on aged sheets from Example No. 1., supra.

EXAMPLE NO. 3

Example No. 1 was repeated with the following exceptions:

| | |
|---|---|
| A) The precoat as used in Example 1 was replaced by the following composition: | |
| sodium 5-sulfo-dimethyl-isophthalate | 2500 g |
| pigment 2820[1] | 5000 g |
| resin VN[2] | 7000 g |
| 50% microwax Dispersion[3] | 600 cc |
| water to make | 100 liters |
| ammonia, to adjust the pH to 6 | |
| B) The diazo sensitizing solution was replaced by the following Fast Speed Blackline solution: | |
| sulfuric acid | 100 cc |
| citric acid | 3000 g |
| thiourea | 4000 g |
| solubilizer HI[10] | 1500 g |
| solubilizer PO[11] | 1000 g |
| solubilizer[12] | 1000 g |
| coupler 144[4] | 450 g |
| coupler 195[13] | 75 g |
| coupler 0[14] | 450 g |

-continued

| | |
|---|---|
| coupler 660[15] | 150 g |
| coupler 670[16] | 200 g |
| coupler 950 | 550 g |
| PnB[17] | 250 cc |
| isopropyl Alcohol | 1000 cc |
| diazo 50[18] | 350 g |
| diazo 59S[5] | 350 g |
| diazo 8[19] | 500 g |
| zinc chloride predissolved in water | 4000 g |
| 0.5% Diazotint Red | 100 cc |
| pigment 2820[1] | 100 g |
| resin VW-2[2] | 2000 cc |
| water to make | 100 Liters: |

[1]Pigment 2820: amorphous silica powder of 1.5 micron particle size, (Andrews Paper & Chemical Co., Inc., Port Washington, New York.)
[2]Resin VN: Vinyl acetate copolymer dipersion, (Andrews Paper & Chemical Co., Inc., supra
[3]Microwax dispersion, (Andrews Paper & Chemical Co., Inc. supra.)
[10]Solubilizer HI: 2-ketohexamethyleneimne.
[11]Solubilizer PO: 1,2-Dimethylxanthine.
[12]Solubilizer K: Trimethylxanthine.
[13]Coupler 195: composite of 2,3-dihydroxynaphthalene and 1,3,7 trimethylxanthine.
[14]Coupler 0: 2,7-dihydroxynaphthalene-3,6-disulfonic acid disodium salt.
[15]Coupler 660: 1-hydroxynaphthalene-2-carboxylic acid-3' morpholino propylamide.
[16]Coupler 670: Cyanoacet-morpholide.
[17]PnB: Propyleneglycol-mono-butylether.
[18]Diazo 50: 1-Diazo-2,5-diisopropxy-4-morpho-linobenzene chloride 1/2 zinc chloride.
[19]Diazo 8:1-Diazo-4-N,N-dimethylaminobenzene chloride, zinc chloride.

EXAMPLE NO. 4

Example No. 3 was repeated except for the precoat (A) composition to which was added, for 100 liters:

| | |
|---|---|
| NaSCN | 1000 g |

EXAMPLE NO. 5

Example No. 3 was repeated for the precoat (A) composition from which was omitted sodium-5-sulfo-dimethyl-iso-phthalate.

Sample sheets from Examples No 3, No. 4 and No. 5 were tested in the same manner as sample sheets from Examples No. 1 and No. 2.

The pre-aged samples from Example No. 5 exhibited a strong grayish print background which did not show on samples from Examples No. 3 and No. 4. Samples from Example No. 4 excelled by higher print contrast and print dye density.

EXAMPLE NO. 6

Example No. 3 was repeated with the following exceptions:

The precoat was replaced by the following composition:

| | |
|---|---|
| Resin PK-33[20] | 1000 g |
| p-Toluene sulfonic acid | 500 g |
| sodium-5-sulfo-iso-phthalate | 1500 g |
| sodium thiocyanate | 1500 g |
| pigment 2820[1] | 4000 g |
| resin VN[2] | 5000 cc |
| polyvinyl alcohol | 1250 g |

-continued

| | |
|---|---|
| methylated urea formaldehyde resin | 5000 g |
| water to make | 100 Liters |
| ammonia to adjust to pH:6 | |

[1]Pigment 2820: amorphous silica powder of 1.5 micron particle size, (Andrews Paper & Chemical Co., Inc., Port Washington, New York.)
[2]Resin VN: Vinyl acetate copolymer dipersion, (Andrews Paper & Chemical Co., Inc., supra
[20]Polyvinylpyrrolidone

EXAMPLE NO. 7

Example No. 6 was repeated with the exception that in the precoat were omitted:

sodium-5-sulfo-iso-phthalate and sodium thiocyanate

Sensitized sheets from Examples Nos. 6 and 7 underwent the accelerated aging tests as described heretofore, with the following results:

Prints from Example No. 7 exhibited pronounced gray background while prints from Example No. 6 exhibited only a very slightly grayish background.

EXAMPLE NO. 8

Example No. 1 was repeated except for the following:

The alkaline beater sized paper containing calcium carbonate as filler was provided with a surface size from a surface size preparation that contained:

| | |
|---|---|
| polyvinyl alcohol (99% hydrolyzed) | 4000 g |
| starch (Penford Gum) | 16000 g |
| p-Toluene sulfonic acid | 500 g |
| methyated urea-formaldehyde resin | 5000 g |
| water to make 100 Liters | |
| ammonia, to adjust to pH:6 | |

EXAMPLE NO. 9

Example No. 8 was repeated except for the following:

From the precoat composition were entirely omitted:

sodium-5-Sulfo-Iso-Phthalate and

NaSCN.

After accelerated aging tests as described heretofore the following differences were observed:

Prints from Example No. 9 exhibited a much more pronounced grayish print background than prints from Example No. 8.

EXAMPLE NO. 10

Example No. I was repeated except for the precoat composition which was replaced as follows:

| | |
|---|---|
| Pigment 2820[1] | 5500 |
| Resin PK-33[20] | 750 g |
| Polyglycol sulfo-isophthalate polyester copolymer[21] | 3000 g |
| Dispersion F[22] | 750 cc |
| Binder PA | 500 g |

-continued

| | |
|---|---|
| Citric Acid | 1000 g |
| Water to make | 100 Liters |

[1]Pigment 2820: amorphous silica powder of 1.5 micron particle size, (Andrews Paper & Chemical Co., Inc., Port Washington, New York.)
[20]Polyvinylpyrrolidone
[21]Eastman AQ 38S Polymer.
[22]Available from Andrews Paper Chemical Company, supra.

[21] Eastman AQ 38S Polymer.
[22] Available from Andrews Paper and Chemical Company, supra.

Sensitized samples from Examples No. 10 and No.2 were exposed to UV light behind a Kodak Projection Print Scale and developed in an atmosphere of ammonia and water vapors on a commercial Ozamatic diazotype printing machine immediately after coating and drying.

Prints from Example No. 10 exhibited conventional features in respect to printing speed and print contrast, without penetration marks. Prints from Example No.2 printed slightly slower and exhibited many tiny dark blue penetration spots.

Sensitized sheets from both examples were incubated for 24 hours in a closed oven with an atmosphere of 50% relative humidity at 50° C. Such exposure is an accelerated aging test and simulates shelf storage of 4 months under ambient warehouse conditions. After 24 hours, the sample sheets were printed and developed in the same manner as the non-aged sample sheets.

What is claimed is:

1. A diazotype reproduction material, which comprises:

a) a sheet of fibrous paper base having a top surface and a bottom surface;

b) a precoating on the top surface of the paper base, containing an anionic contributing compound selected from the group consisting of:
isophthalic-5-sulfonic acid,
dimethyl isophthalic-5-sulfonic acid,
polymers and copolymers of polyesters with isophthalic sulfonic acid radicals,
hexafluophosphoric acid,
fluoboric acid,
hexachlorostannic acid,
tungstic acid,
thyiocyanic acid, and mixtures thereof; and c) at least one overcoat on the precoat, which is a light-sensitive acidic diazotype composition.

2. A diazotype reproduction material according to claim 1, wherein said paper base has a pH below 7.

3. A diazotype reproduction material according to claim 1, wherein said paper base has a pH of at least 7.

4. A diazotype reproduction material according to claim 3, wherein said paper base contains alkaline fillers.

5. A diazotype reproduction material according to claim 4 wherein the alkaline filler is calcium carbonate.

6. A diazotype reproduction material of claim 1 wherein the top surface of the base paper has a reaction zone containing the product of a reaction between the anion-contributing compound and a diazonium compound.

7. A diazotype reproduction material of claim 1 which is backcoated to reduce curl.

8. A method for making diazotype reproduction material with improved shelf life and print performance, comprising pre-coating an alkaline base paper prior to the application of a diazotype sensitizing layer, with a coating containing one or more water soluble salts of a compound selected from the group consisting of:

isophthalic-5-sulfonic acid, dimethyl iso phthalic-5-sulfonic acid, polymers and copolymers of polyesters with isophthalic sulfonic acid radicals,
hexafluophosphoric acid,
fluoboric acid,
hexachlorostannic acid,
tungstic acid,
thiocyanic acid and mixtures thereof; and overcoating the pre-coat with a light-sensitive diazonium compound.

* * * * *